United States Patent
Heo et al.

(10) Patent No.: US 10,643,675 B2
(45) Date of Patent: May 5, 2020

(54) MEMORY DEVICE DETERMINING OPERATION MODE BASED ON EXTERNAL VOLTAGE AND METHOD OF OPERATING THE SAME

(71) Applicant: SAMSUNG ELECTRONICS CO., LTD., Suwon-si, Gyeonggi-do (KR)

(72) Inventors: Jin-Seok Heo, Yongin-si (KR); Joung-Wook Moon, Yongin-si (KR); Ki-Ho Kim, Daegu (KR); Jin-Hyeok Baek, Busa (KR); Seok-Hun Hyun, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/103,261

(22) Filed: Aug. 14, 2018

(65) Prior Publication Data
US 2019/0259429 A1    Aug. 22, 2019

(30) Foreign Application Priority Data
Feb. 20, 2018    (KR) ........................ 10-2018-0020019

(51) Int. Cl.
  *G11C 7/10*  (2006.01)
  *G11C 11/4074*  (2006.01)
  (Continued)

(52) U.S. Cl.
  CPC .............. *G11C 7/1045* (2013.01); *G06F 1/26* (2013.01); *G11C 7/1057* (2013.01);
  (Continued)

(58) Field of Classification Search
  CPC ........... G11C 7/1045; G11C 7/14; G11C 7/22; G11C 11/4074; G11C 16/28; G11C 11/413; G11C 11/34; G06F 1/26
  See application file for complete search history.

(56) References Cited

U.S. PATENT DOCUMENTS 6,087,851 A * 7/2000 Kim ............... H03K 19/017581
                                                  326/63
7,598,762 B2 * 10/2009 Byun ................... G11C 7/1048
                                                  324/537
(Continued)

FOREIGN PATENT DOCUMENTS

JP        5205030 B2    6/2013
KR        10937996       1/2010
(Continued)

OTHER PUBLICATIONS

English Translation for JP2009099012 (Year: 2019).*

*Primary Examiner* — Khamdan N. Alrobaie
(74) *Attorney, Agent, or Firm* — Volentine, Whitt & Francos PLLC

(57) ABSTRACT

A memory device determines an operation mode based on an external voltage. The memory device includes a cell array including a plurality of memory cells; and a mode selector that detects a level of at least one voltage signal externally provided and selects any one of a plurality of operation modes corresponding to a plurality of standards according to a result of detecting the level of the at least one voltage signal. The memory device further includes a mode controller that, in response to a mode selecting signal from the mode selector, outputs setting information for setting the memory device to communicate with a memory controller via an interface according to a selected standard from among the plurality of standards; and a calibrating circuit that generates a control code for controlling circuit blocks in the memory device according to the setting information.

20 Claims, 12 Drawing Sheets

(51) Int. Cl.
    *G11C 16/28*     (2006.01)
    *G06F 1/26*      (2006.01)
    *G11C 11/413*    (2006.01)
    *G11C 7/22*      (2006.01)
    *G11C 7/14*      (2006.01)
    *G11C 29/00*     (2006.01)
    *G11C 11/4096*   (2006.01)
    *G11C 11/4093*   (2006.01)

(52) U.S. Cl.
    CPC .............. *G11C 7/1084* (2013.01); *G11C 7/14* (2013.01); *G11C 7/22* (2013.01); *G11C 11/4074* (2013.01); *G11C 11/4093* (2013.01); *G11C 11/4096* (2013.01); *G11C 11/413* (2013.01); *G11C 16/28* (2013.01); *G11C 29/00* (2013.01)

(56) References Cited

U.S. PATENT DOCUMENTS

| | | |
|---|---|---|
| 7,688,104 B2 | 3/2010 | Park |
| 8,680,900 B2 | 3/2014 | Wang et al. |
| 9,306,569 B2 | 4/2016 | Yu et al. |
| 9,543,952 B2 | 1/2017 | Lee |
| 9,830,954 B2 | 11/2017 | Hacking et al. |
| 2014/0368249 A1 | 12/2014 | Lee |
| 2018/0018913 A1* | 1/2018 | Kim ..................... G09G 3/2092 |

FOREIGN PATENT DOCUMENTS

| | | |
|---|---|---|
| KR | 1020140146690 | 12/2014 |
| KR | 1020150006693 | 1/2015 |
| KR | 101570118 | 11/2015 |

* cited by examiner

MEMORY DEVICE DETERMINING OPERATION MODE BASED ON EXTERNAL VOLTAGE AND METHOD OF OPERATING THE SAME

CROSS-REFERENCE TO RELATED APPLICATION

A claim for priority under 35 U.S.C. § 119 is made to Korean Patent Application No. 10-2018-0020019, filed on Feb. 20, 2018, in the Korean Intellectual Property Office, the entire contents of which are hereby incorporated herein by reference.

BACKGROUND

The present inventive concepts relate to a memory device, and more particularly to a memory device that determines an operation mode based on an external voltage, and a method of operating such memory device.

Currently, the capacity and speed of semiconductor memory devices widely used in high-performance electronic systems are increasing. An example of such memory devices includes dynamic random access memory (DRAM), which is volatile memory that determines data based on charges stored in a capacitor.

Memory devices typically communicate with a memory controller via an interface according to various standards. During processing and manufacture of a memory device, an interface standard for communication with a memory controller is determined, and the memory device is implemented to perform communication using the interface according to the determined standard. However, the need to manufacture diverse memory devices according to various kinds of standards has lowered production efficiency.

SUMMARY

Embodiments of the inventive concepts provide a memory device capable of improving production efficiency by selecting an operation mode corresponding to a standard applied to a system and configuring internal circuit blocks for the memory device to perform an interface according to a selected standard and a method of operating the memory device.

Embodiments of the inventive concepts provide a memory device including a cell array including a plurality of memory cells; a mode selector configured to detect a level of at least one voltage signal externally provided and select any one of a plurality of operation modes corresponding to a plurality of standards according to a result of detecting the level of the voltage signal; a mode controller configured, in response to a mode selecting signal from the mode selector, to output setting information for setting the memory device to communicate with a memory controller via an interface according to a selected standard from among the plurality of standards; and a calibrating circuit configured to generate a control code for controlling circuit blocks in the memory device according to the setting information.

Embodiments of the inventive concepts further provide a memory device including a memory cell array including a plurality of memory cells; a mode selector configured to detect a level of at least one power voltage externally provided and select one of a low power double data rate 4 (LPDDR4) standard mode or a low power double data rate 4X (LPDDR4X) standard mode as a standard for interfacing with a memory controller according to a result of detecting the level of the at least one power voltage; a mode controller configured to output setting information corresponding to a selected standard mode in response to a mode selecting signal from the mode selector; and a calibrating circuit configured, in response to the setting information from the mode controller, to generate a first control code for adjusting a voltage level of output data of the memory device to a first level in the LPDDR4 standard mode and adjusting the voltage level of the output data of the memory device to a second level different from the first level in the LPDDR4X standard mode.

Embodiments of the inventive concepts still further provide a method of operating a memory device including a mode selector and a calibrating circuit, the method including receiving, by the mode selector, a first command and one or more power voltages during an initial operation of a system; detecting, by the mode selector, levels of the one or more supply voltages in response to reception of the first command; selecting, by the mode selector, an operation mode corresponding to any one selected from among a plurality of standards according to a result of detecting the levels of the power voltages; and performing, by the calibrating circuit, a calibrating operation to adjust a voltage level of output data of the memory device and enable/disable an on-die termination (ODT) circuit according to the selected operation mode.

BRIEF DESCRIPTION OF THE DRAWINGS

The foregoing and other features of the inventive concepts will be described below in greater detail with reference to the accompanying drawings, wherein.

DETAILED DESCRIPTION OF THE EMBODIMENTS

Hereinafter, example embodiments of the inventive concepts will be described in detail with reference to the accompanying drawings.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
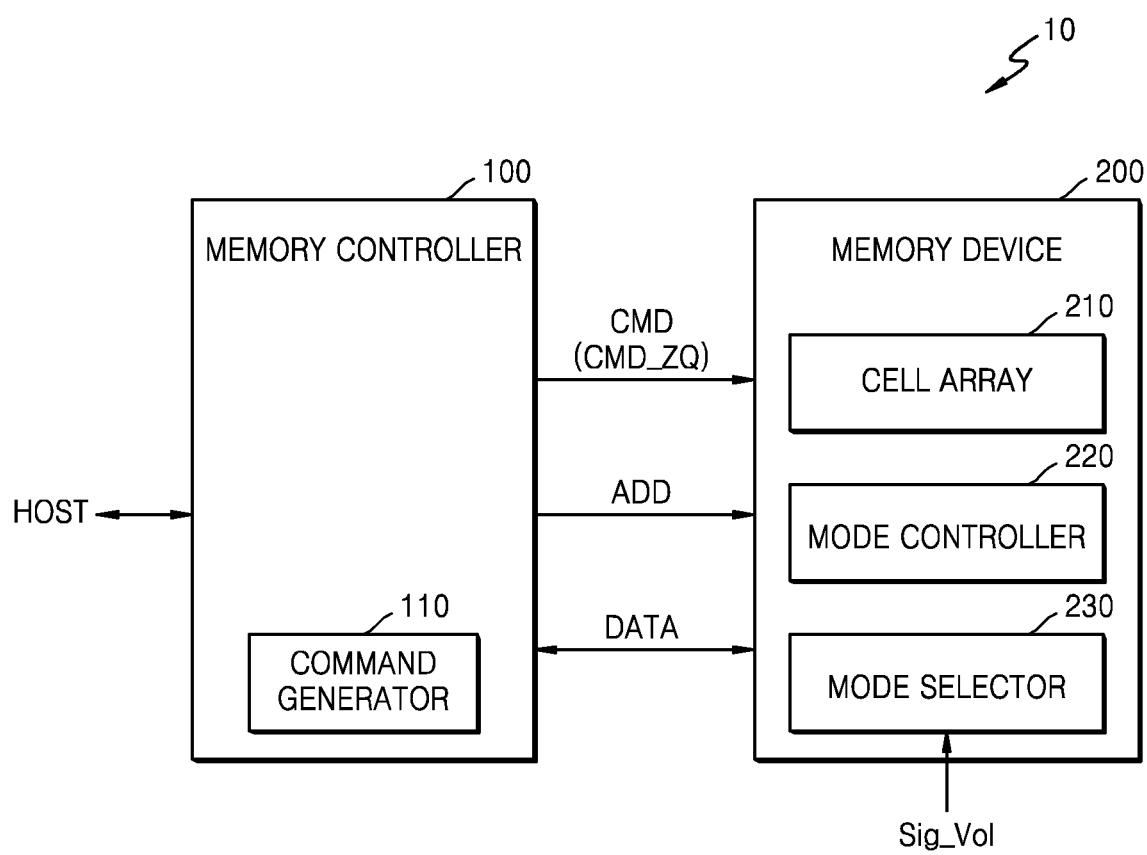
FIG. 1 illustrates a block diagram of a memory system according to an example embodiment of the inventive concepts.

FIG. 1 illustrates a block diagram of a memory system according to an example embodiment of the inventive concepts.

Referring to FIG. 1, a memory system 10 includes a memory controller 100 and a memory device 200. The memory controller 100 provides various signals to the memory device 200 to control memory operations such as for example a write operation and a reading operation. For example, the memory controller 100 includes a command generator 110 that may generate various commands, and the memory controller 100 may provide a command CMD and an address ADD to the memory device 200 to access data DATA from memory cells of a memory cell array 210. The command CMD may include a command for a normal memory operation such as a data write operation and a data read operation. Furthermore, the memory controller 100 may provide a command CMD for various control operations in the memory device 200. For example, in response to a calibrating command CMD_ZQ, the memory device 200 may perform operations for configuring various circuit blocks in the memory device 200, e.g., an on-die termination (ODT) circuit (not shown), an output driver (not shown), and/or various other circuit blocks.

The memory controller 100 may access the memory device 200 in response to a request from a host HOST. The memory controller 100 may communicate with the host HOST using various protocols. For example, the memory controller 100 may communicate with the host HOST using any of a variety of different communication protocols such as peripheral component interconnect-express (PCI-E), advanced technology attachment (ATA), serial ATA (SATA), parallel ATA (PATA), or serial attached SCSI (SAS), among other communication protocols. Furthermore, various other interface protocols such as for example universal serial bus (USB), multimedia card (MMC), enhanced small disk interface (ESDI), or integrated drive electronics (IDE) among other interface protocols may be applied as a protocol between the host HOST and the memory controller 100.

The memory device 200 may include various types of memory. For example, the memory device 200 may include dynamic random access memory (DRAM) such as double data rate synchronous dynamic random access memory (DDR SDRAM), low power double data rate (LPDDR) SDRAM, graphics double data rate (GDDR) SDRAM, and Rambus™ dynamic random access memory (RDRAM), among other various types of memory. However, example embodiments are not necessarily limited to the aforementioned types of memory. For example, the memory device 200 may include a non-volatile memory such as flash memory, magnetic RAM (MRAM), ferroelectric RAM (Fe-RAM), phase change RAM (PRAM), and resistive RAM (ReRAM), among other types of non-volatile memory.

The memory device 200 may communicate with the memory controller 100 via an interface according to various standards. For example, the memory controller 100 and the memory device 200 may perform (i.e., implement) various interfaces such as low power double data rate 4 (LPDDR4), low power double data rate 4X (LPDDR4X), and various other types of standards. Hereinafter, LPDDR4 and LPDDR4X will be exemplified in example embodiments of the inventive concepts. However, the example embodiments of the inventive concepts are not necessarily limited to the aforementioned interfaces, and the example embodiments may be implemented using various other types of standards.

According to an example embodiment, the memory device 200 may select any one of two or more standards and communicate with the memory controller 100 via an interface according to the selected standard. For example, the memory device 200 may not need to be manufactured using diverse manufacturing processes according to various standards. Rather, the memory device 200 according to an example embodiment may select an operation mode corresponding to a particular standard (e.g., a standard applied to the memory system 10 or the memory controller 100) from among a plurality of standards, and may communicate with the memory controller 100 via an interface according to the selected operation mode.

For example, mode selector 230 of the memory device 200 may determine and select an operation mode of the memory device 200 by using (i.e., responsive to) an external voltage signal Sig_Vol. For example, the mode selector 230 may receive two or more voltage signals Sig_Vol, detect a difference between the levels of the voltage signals Sig_Vol, and determine a standard applied to the memory system 10 according to the result of detection. Furthermore, the mode selector 230 may select one of a plurality of operation modes according to the determined standard. For example, according to a result of selection of the mode selector 230, the memory device 200 may operate in a first operation mode (e.g., an LPDDR4 standard mode) for performing an interface according to the LPDDR4 standard, or may operate in a second operation mode (e.g., an LPDDR4X standard mode) for performing an interface according to the LPDDR4X standard. In other embodiments, the memory device 200 may operate in further operation modes in addition to the aforementioned first and second operation modes.

Mode controller 220 of the memory device 200 may perform an operation for configuring various circuit blocks in the memory device 200 according to a selected operation mode. For example, the memory device 200 may include various circuit blocks related to memory operations such as a calibrating circuit, an on-die termination (ODT) circuit, and an output driver, and the mode controller 220 may output first setting information for configuring the various circuit blocks to operate the memory device 200 in the first operation mode, or output second setting information for configuring the various circuit blocks to operate the memory device 200 in the second operation mode. Based on a result of selection of the mode selector 230, the mode controller 220 may output setting information for an interface according to a standard identical to a standard applied to the memory system 10 or the memory controller 100. Furthermore, operation characteristics of the various circuit blocks such as the calibrating circuit, the ODT circuit, and the output driver of the memory device 200 may be configured based on at least one of a result of selection from the mode selector 230 and setting information from the mode controller 220.

According to an example embodiment, the mode controller 220 may include a mode register set (MRS), and MRS information provided from the memory controller 100 may be stored in the MRS. For example, the MRS information of the MRS may include information regarding a plurality of fields, and setting information provided to circuit blocks in the memory device 200 may be generated by decoding the information regarding the fields. In this case, when the memory controller 100 performs (i.e., implements) an interface according to the LPDDR4 standard, the mode controller 220 may generate setting information through a first decoding operation corresponding to the LPDDR4 standard. Furthermore, when the memory controller 100 performs an interface according to the LPDDR4X standard, the mode controller 220 may generate setting information through a second decoding operation corresponding to the LPDDR4X standard. In other words, different types of setting information may be generated by using the same field values of the MRS according to results of selection from the mode selector 230.

According to an example embodiment, the memory device 200 may transmit and receive various types of signals to and from the memory controller 100, and the memory device 200 may include ODT circuits for providing termination resistance in correspondence to at least some of the various types of signals. Operating states of the ODT circuits may be set according to setting information from the mode controller 220. For example, enable states of the ODT circuits may be controlled differently in the first operation mode and the second operation mode, or the termination resistance may be set differently in the first operation mode and the second operation mode. Furthermore, the operation states of the output driver for generating output data may be set differently according to the setting information from the mode controller 220. For example, logic high levels VOH may be adjusted to be different in the first operation mode and the second operation mode. For example, ratios between the logic high levels VOH of output data and power voltage VDDQ of the output driver may be set differently in the first operation mode and the second operation mode.

According to an example embodiment, the mode selector 230 may perform a mode selecting operation in response to a command CMD from the memory controller 100. For example, when the memory device 200 is initially operated, the memory device 200 may receive a calibrating command CMD_ZQ from the memory controller 100, and the memory device 200 may perform a mode selecting operation based on a difference between the levels of the voltage signals Sig_Vol as previously described, before a calibrating operation is performed. Furthermore, the memory device 200 may receive various other types of commands CMD from the memory controller 100 for an initialization operation, and the mode selecting operation as described above may be performed in response to reception of a different type of command CMD during the initialization operation.

According to an example embodiment as described above, the memory device 200 that performs interfaces according to the LPDDR4 and LPDDR4X standards may be manufactured through a unified manufacturing process, and an interface according to the LPDDR4 standard or the LPDDR4X standard may be determined through self-detection during the initial operation of the memory device 200. As such, there is no need to adjust the production quantity of memory devices 200 according to predicted demand, the production efficiency of the memory devices 200 may be improved through a unified manufacturing process, and a risk of stock quantity management may be eliminated. In other words, according to embodiments of the inventive concepts, it is unnecessary to separately manufacture memory devices that respectively support for example the LPDDR4 and LPDDR4X standards. That is, memory devices that are each capable to support for example both the LPDDR4 and LPDDR4X standards may be manufactured in (using) a same manufacturing process or production, and during initial operation each of the memory devices may determine and select as an interface standard either the LPDDR4 standard or the LPDDR4X standard.

Figure 2:
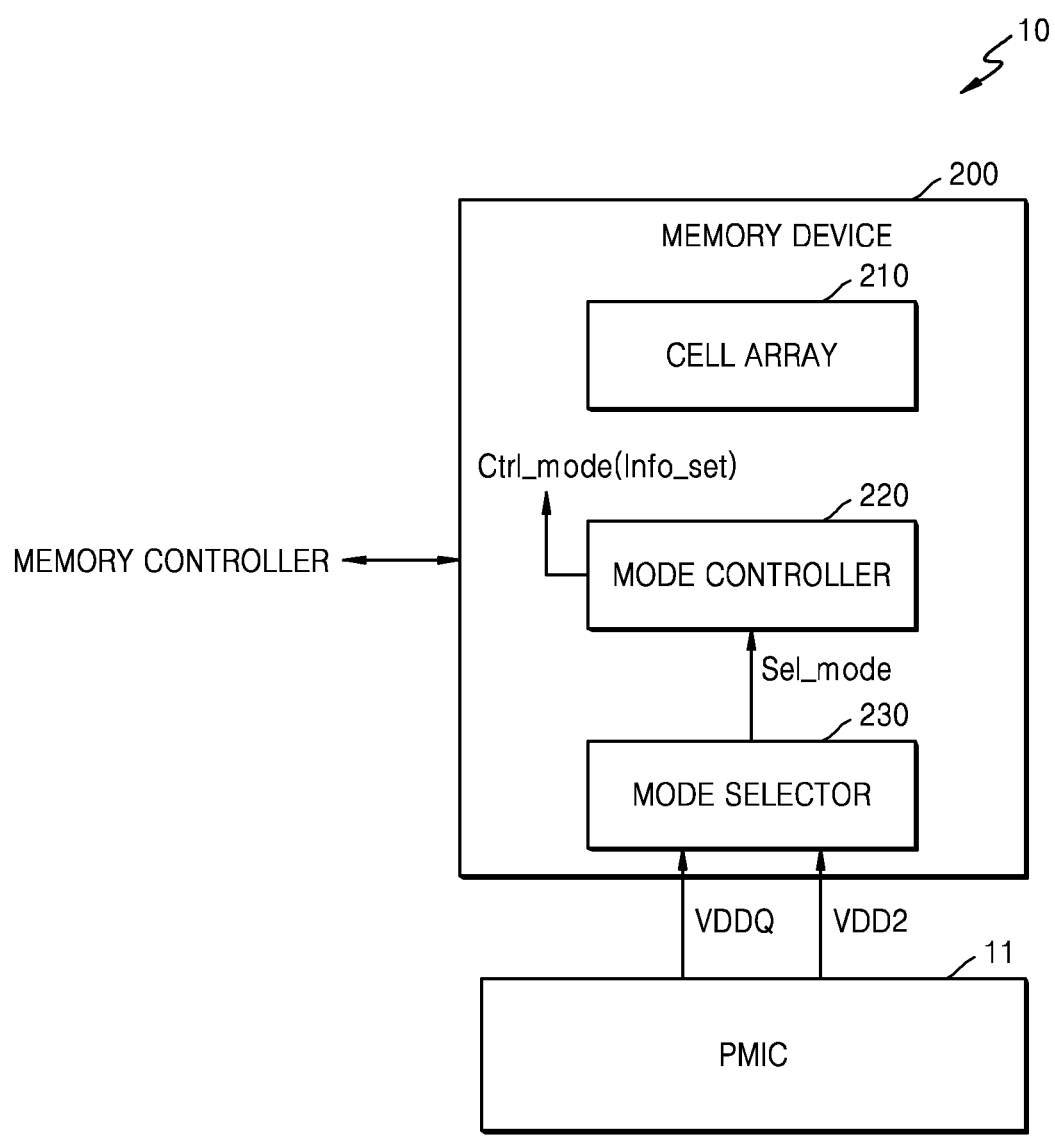
FIG. 2 illustrates a block diagram showing an example of operation of a memory device of FIG. 1.

FIG. 2 illustrates a block diagram of an example of operation of the memory device 200 of FIG. 1. In the memory system 10 shown in FIG. 2, a power management integrated circuit (PMIC) 11 that provides various voltage signals to the memory device 200 is further shown.

The memory device 200 may receive an external voltage signal during an initial operation and perform a mode selecting operation based thereon. For example, during an initial operation when the memory device 200 performs an interface according to a low power double data rate (LPDDR) standard, the memory device 200 may receive various power voltages including a first power voltage VDDQ and a second power voltage VDD2 from the PMIC 11. For example, the first power voltage VDDQ may be provided as power for an input/output circuit in the memory device 200. Furthermore, various types of power voltages used by a cell core and peripheral circuits provided in the memory device 200 may be provided. For example, the second power voltage VDD2 may be provided as power for the peripheral circuits. Although not shown in FIG. 2, a third power voltage VDD1 used as power for the cell core, and a fourth power voltage VDDQL which is power for an input/output circuit and has a different level from that of the first power voltage VDDQ, may be further provided to the memory device 200.

The mode selector 230 may detect a difference between voltage levels of the first power voltage VDDQ and the second power voltage VDD2, and may select one of a plurality of operation modes as the operation mode of the memory device 200 based on the detected difference between the voltage levels. According to an example embodiment, at least one of the first supply voltage VDDQ and the second supply voltage VDD2 may be divided by a voltage divider (not shown) in the memory device 200, and an operation for detecting a level difference may be performed using the divided voltage. Furthermore, a mode selecting signal Sel_mode from the mode selector 230 may be provided to the mode controller 220, and the mode controller 220 may output a mode control signal Ctrl_mode in response to the mode selecting signal Sel_mode. The mode control signal Ctrl_mode may include setting information Info_set for configuring various circuit blocks in the memory device 200.

As described above, the memory device 200 may directly detect various voltage signals supplied from the PMIC 11 and determine an operation mode. Based on the operation mode, various circuit blocks such as a calibrating circuit, an output driver, and an ODT circuit may be configured, such that the memory device 200 performs an interface according to the LPDDR4 standard or the LPDDR4X standard. For example, at least one of the first power voltage VDDQ and the second power voltage VDD2 may be at a different voltage level depending on a system in which the memory device 200 is employed (or according to a standard employed in a memory controller), and an operation for configuring circuit blocks may be performed, such that an interface may be performed according to a standard corresponding to a selected operation mode.

Although FIG. 2 shows a mode selecting operation using the first power voltage VDDQ and the second power voltage VDD2, example embodiments are not limited to using the first power voltage VDDQ and the second power voltage VDD2. For example, a mode selecting operation may be performed by detecting one or more selected power voltages from among a plurality of power voltages provided to the memory device 200 including first to fourth power voltages described above (that is including third power voltage VDD1 and fourth power voltage VDDQL).

Figure 3:
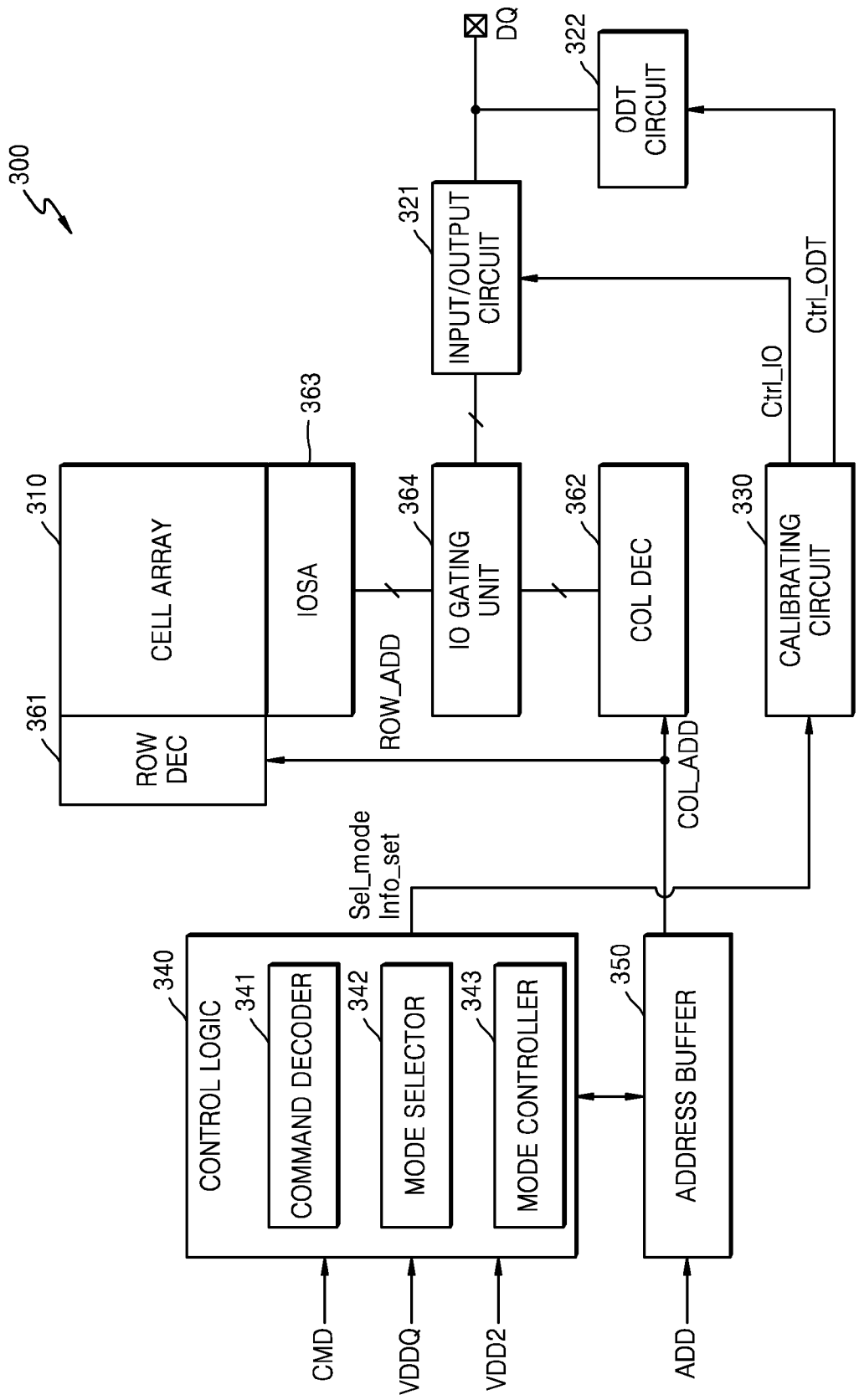
FIG. 3 illustrates a block diagram of a memory device according to an example embodiment of the inventive concepts.

FIG. 3 illustrates a block diagram of an example of a memory device according to an example embodiment of the inventive concepts.

Referring to FIG. 3, memory device 300 includes a cell array 310, an input/output circuit 321, an ODT circuit 322, a calibrating circuit 330, control logic 340 and an address buffer 350. The memory device 300 further includes a row decoder 361, a column decoder 362, an input/output sense amplifier 363, and an input/output gating unit 364. Furthermore, the control logic 340 further includes a command decoder 341, a mode selector 342, and a mode controller 343. Although FIG. 3 shows an example in which the mode selector 342 and the mode controller 343 are included in the control logic 340, example embodiments are not limited to including the mode selector 342 and the mode controller 343 in the control logic 340, and at least one of the mode selector 342 and the mode controller 343 may be provided outside the control logic 340.

The address buffer 350 may receive an address ADD provided from a memory controller (e.g., 100 shown in FIG. 1). The address ADD may include a row address ROW_ADD for indicating a row of the cell array 310 and a column address COL_ADD for indicating a column of the cell array 310. The input/output gating unit 364 may provide read data from the input/output sense amplifier 363 to the outside through the input/output circuit 321. Furthermore, the input/output circuit 321 may include an input buffer (not shown), and data may be provided to the cell array 310 through the input buffer and the input/output gating unit 364 during a data write operation. The input/output circuit 321 provides the read data to the outside and receives data for a write operation through an input/output pad DQ.

The control logic 340 may control the overall operation of the memory device 300, and the command decoder 341 may decode a command CMD provided from the memory controller. The type of the command CMD provided to the memory device 300 may be determined by the command decoder 341 according to a result of decoding the command CMD, and the selection of an operation mode and the configuration of circuit blocks as described above may be performed in response to a particular command CMD. For example, when a command CMD for performing calibration during an initial operation of the memory device 300 is received, the memory device 300 may perform a mode selecting operation and a configuring operation as described previously.

Furthermore, the mode selector 342 may compare the levels of power voltages provided from the outside (i.e., externally provided), and perform a mode selecting operation based on a result of comparing the levels of power voltages. For example, a first power voltage VDDQ and a second power voltage VDD2 may be provided to the memory device 300 according to the LPDDR4 and LPDDR4X standards, and the mode selector 342 may perform a mode selecting operation based on a difference between the levels of the first power voltage VDDQ and the second power voltage VDD2. Furthermore, the mode controller 343 may generate setting information Info_set corresponding to a selected standard based on a mode selection result.

According to an example embodiment, at least one of a mode selecting signal Sel_mode from the mode selector 342 and the setting information Info_set may be provided to the calibrating circuit 330. The calibrating circuit 330 may also provide a control code Ctrl_IO to the input/output circuit 321 for adjusting the voltage level of a data signal based on a mode selecting signal Sel_mode and/or the setting information Info_set, and may also provide a control code Ctrl_ODT to the ODT circuit 322 to enable on-die termination or adjust a termination resistance value.

Figure 4:
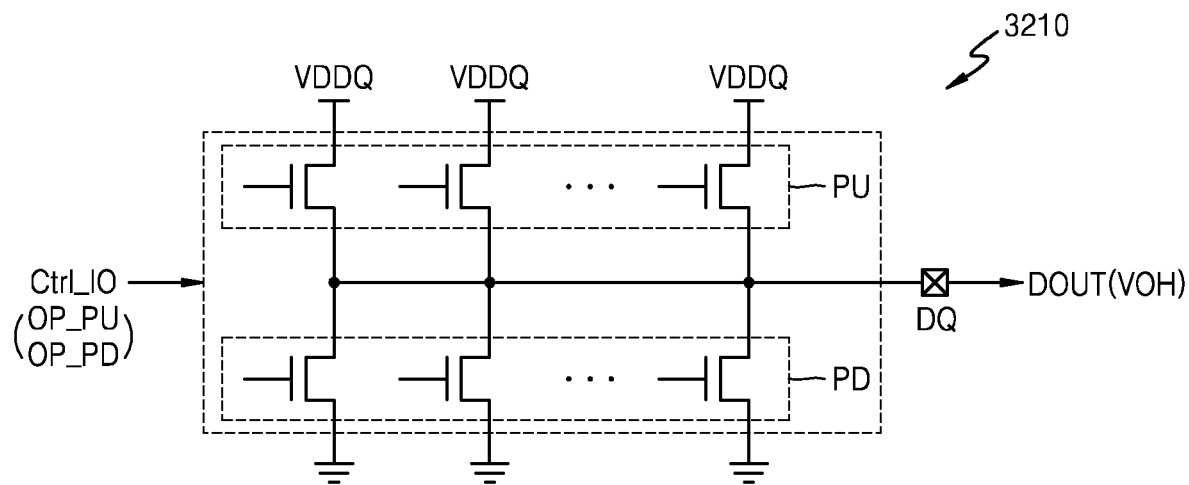
FIG. 4 illustrates a circuit diagram showing an example of controlling an output driver according to mode selection in an embodiment of the inventive concepts.
Figure 5:
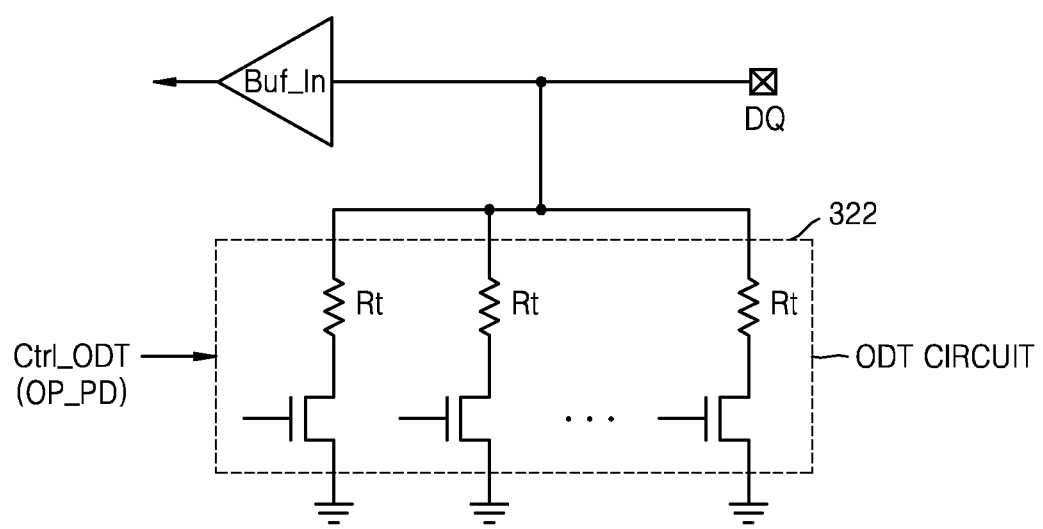
FIG. 5 illustrates a circuit diagram showing an example of controlling an on-die termination (ODT) circuit according to mode selection in an embodiment of the inventive concepts.

FIG. 4 illustrates a circuit diagram showing an example of controlling an output driver according to mode selection in an embodiment of the inventive concepts. FIG. 5 illustrates a circuit diagram showing an example of controlling an on-die termination (ODT) circuit according to mode selection in an embodiment of the inventive concepts.

Referring to FIG. 4, the output driver 3210 may be implemented as part of the input/output circuit 321 shown in FIG. 3, and may receive a first power voltage VDDQ as power and provide output data DOUT through an input/output pad DQ based on a pull-up operation and a pull-down operation. The logic high voltage of the output data DOUT may correspond to VOH, whereas the logic low voltage may correspond to the ground voltage. The voltage level of the VOH at an interface according to the LPDDR4 standard and the voltage level of the VOH at an interface according to the LPDDR4X standard may be different from each other.

The output driver 3210 may include a pull-up unit (or a pull-up driver) PU including one or more transistors connected in parallel with each other and to the first power voltage VDDQ, and may include a pull-down unit (or a pull-down driver) PD including one or more transistors connected in parallel with each other and to the ground voltage. Although FIG. 4 shows that the pull-up unit PU and the pull-down unit PD each include a plurality of NMOS transistors, example embodiments are not limited each including a plurality of NMOS transistors. In other embodiments, each of the pull-up unit PU and the pull-down unit PD may include an NMOS transistor and a PMOS transistor together. Alternatively, at least one of the pull-up unit PU and the pull-down unit PD may include a PMOS transistor. Also, at least one of the pull-up unit PU and the pull-down unit PD may further include resistance elements (not shown) corresponding to respective transistors.

The control code Ctrl_IO may be provided to the output driver 3210 according to the mode selecting operation and the controlling operation as described previously, and the control code Ctrl_IO may include a pull-up control signal OP_PU for controlling the pull-up unit PU and a pull-down control signal OP_PD for controlling the pull-down unit PD. The transistors of the pull-up unit PU may have a connection state corresponding to the pull-up control signal OP_PU, and the transistors of the pull-down unit PD may have a connection state corresponding to the pull-down control signal OP_PD. The value of the control signal Ctrl_IO may be changed according to an operation mode selected through the mode selecting operation (e.g., an LPDDR4 standard mode or an LPDDR4X standard mode).

For example, when read data is output, the transistors of the pull-up unit PU have ON/OFF states corresponding to the pull-up control signal OP_PU, and the transistors of the pull-down unit PD may be turned off. In this case, the level of a current generated by the pull-up unit PU may vary depending on the ON/OFF states of the transistors of the pull-up unit PU. Accordingly, the voltage level of the VOH may be suitably adjusted according to the LPDDR4 standard mode or the LPDDR4X standard mode.

Referring to FIG. 5, the memory device 300 may include an input buffer Buf_In for receiving write data from an external memory controller via the input/output pad DQ, and also includes the ODT circuit 322 connected to a node of an input end of the input buffer Buf_In. The ODT circuit 322 may include a plurality of transistors and respective termination resistors Rt connected to the plurality of transistors. Also, according to the mode selecting operation and the control operation as described previously, a control code Ctrl_ODT may be provided to the ODT circuit 322, and the transistors of the ODT circuit 322 may have a connection state corresponding to the control code Ctrl_ODT.

Depending on the control code Ctrl_ODT, the enabling of the ODT circuit 322 connected to the input node of the input buffer Buf_In may be controlled or the termination resistance value of the ODT circuit 322 may be adjusted. For example, depending on an operation mode selected through the mode selecting operation (e.g., the LPDDR4 standard mode or the LPDDR4X standard mode), the termination resistance may be or may not be provided to the input node of the input buffer Buf_In. The ODT circuit 322 may be disabled in any one of the LPDDR4 standard mode and the LPDDR4X standard mode, and the ODT circuit 322 may be enabled in the other one of the LPDDR4 standard mode and the LPDDR4X standard mode.

According to an example embodiment, in addition to write data, the memory device 300 may receive various signals such as a command and an address through corresponding pads, and additional ODT circuits may be arranged in correspondence to the various signals. In response to the control signal Ctrl_ODT, only some ODT circuits may be enabled, and other ODT circuits may be disabled. According to an example embodiment, the types of ODT circuits enabled in an interface according to the LPDDR4 standard may be different from the types of ODT circuits enabled in an interface according to the LPDDR4X standard.

Furthermore, according to an example embodiment, any one of the pull-up unit PU and the pull-down unit PD of the output driver 3210 may be a circuit for providing a termination resistance during a data write operation. For example, the ODT circuit 322 shown in FIG. 5 may correspond to the pull-down portion PD of the output driver 3210 shown in FIG. 4, and the control signal Ctrl_ODT for controlling the ODT circuit 322 in this case may include a pull-down control signal OP_PD according to the embodiment described previously.

Figure 6A:
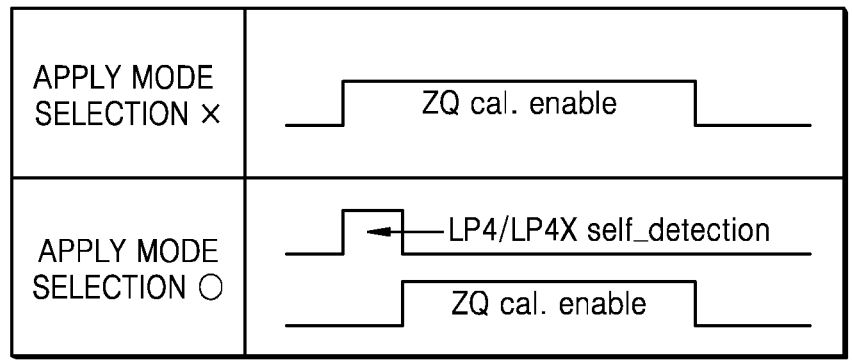
FIG. 6A illustrates a diagram showing timings at which a mode selecting operation is performed in a memory device according to an example embodiment of the inventive concepts.
Figure 6B:
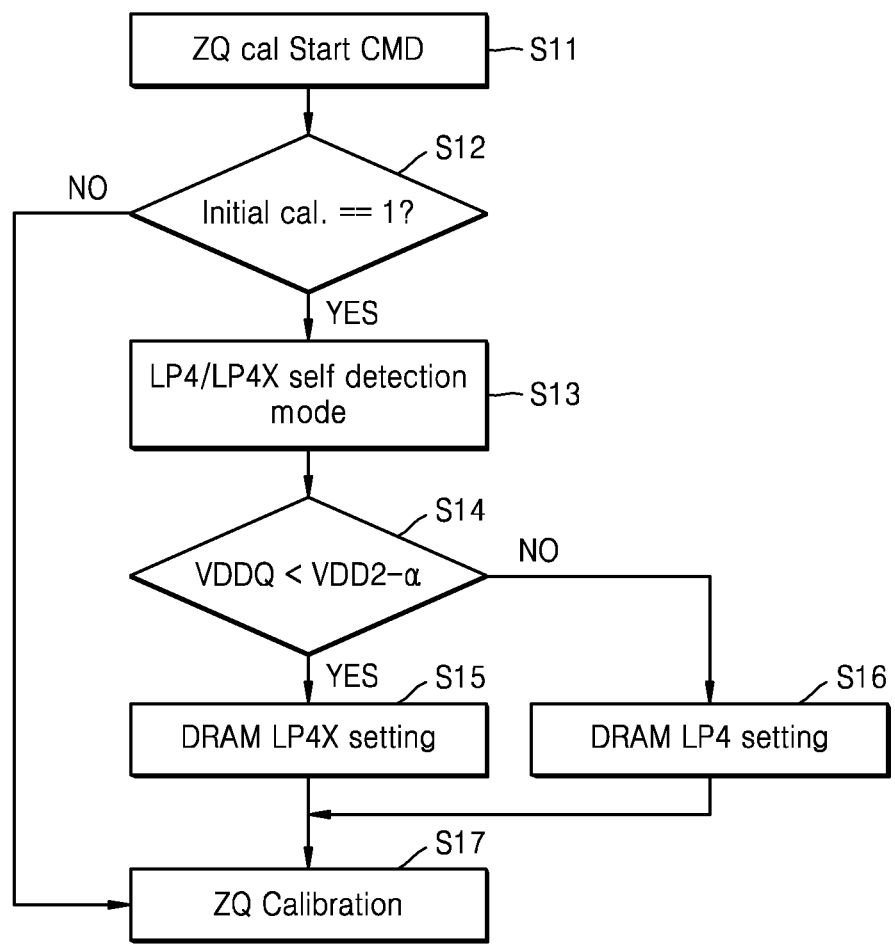
FIG. 6B illustrates a flow chart of a mode selecting operation performed in a memory device according to an example embodiment of the inventive concepts.

FIG. 6A illustrates a diagram showing timings at which a mode selecting operation is performed in a memory device according to an example embodiment of the inventive concepts. FIG. 6B illustrates a flow chart of a mode selecting operation performed in a memory device according to an example embodiment of the inventive concepts.

Referring to FIG. 6A, an initial calibrating (ZQ calibrating) may be performed during an initial operation of a memory device (e.g., 200 in FIG. 2 or 300 in FIG. 3), and a mode selecting operation using a voltage signal according to an example embodiment may be performed in a certain section before the initial calibrating (ZQ calibrating). For example, a portion of a period in which an existing initial calibrating (ZQ calibrating) is performed may be allocated as a period for detecting the level of a voltage signal and, by detecting the levels of the first power voltage VDDQ and/or the second power voltage VDD2, an LPDDR4 (LP4) standard mode and an LPDDR4X (LP4X) standard mode may be determined.

For example, when the memory device (e.g., 200 in FIG. 2 or 300 in FIG. 3) is connected to a memory controller (e.g., 100 in FIG. 1) that performs communication according to an interface of the LPDDR4 standard, the memory device may receive the first power voltage VDDQ and the second power voltage VDD2 having voltage levels according to the LPDDR4 standard, and may perform operations for configuring various circuit blocks in the memory device through a mode selection and a mode configuring operation, such that communication according to the interface of the LPDDR4 standard is performed. On the other hand, when the memory device is connected to a memory controller that performs communication according to an interface of the LPDDR4X standard, the voltage level of at least one of the first power voltage VDDQ and the second power voltage VDD2 may differ as compared to the LPDDR4 standard, and operations for configuring various circuit blocks in the memory device based on results of detecting the first power voltage VDDQ and the second power voltage VDD2 may be performed, such that communication according to an interface of the LPDDR4X standard is performed.

For example, during the initial calibrating (ZQ calibrating), power levels provided to the memory device may be sufficiently stabilized, and thus the first power voltage VDDQ and the second power voltage VDD2 provided to the memory device may have stable voltage levels. Accordingly, a section for mode selection may be set just before the initial calibrating (ZQ calibrating) is performed.

On the other hand, a plurality of calibrations (ZQ Calibrating) may be performed during an operation of the memory device (e.g., 200 in FIG. 2 or 300 in FIG. 3). FIG. 6B shows a detailed example in which a mode selecting operation is performed by mode selector 342 shown in FIG. 3 for example during an initial operation of the memory device.

First, a (first) command CMD requesting execution of a calibration (ZQ Calibrating) may be provided for example from memory controller 100 to a memory device 300 (operation S11), and the memory device 300 may determine whether the received command CMD requesting the calibrating (ZQ Calibrating) command corresponds to an initial calibrating command (operation S12). When it is determined (e.g., by the control logic 340) that the received command CMD is not the initial calibrating command (No in operation S12), the memory device may perform a calibration (ZQ calibrating) immediately without performing the mode selecting operation as described above (operation S17).

On the other hand, when the received calibrating (ZQ Calibrating) command corresponds to the initial calibrating command (Yes in operation S12), the memory device 300 may proceed to an operation for performing mode selection (operation S13). For example, a self detection operation for selecting the LPDDR4 standard or the LPDDR4X standard mode may be performed, and an operation for comparing the levels of power voltages provided from the outside for a mode selecting operation may be performed (operation S14) by mode selector 342. As a result of the comparing the voltage levels, a level difference between the first power voltage VDDQ and the second power voltage VDD2 is compared with a certain threshold value (e.g., α), and a mode configuring operation may be performed based on a result of the comparison. For example, when the second power voltage VDD2 is greater than the first power voltage VDDQ by a threshold value (e.g., a) or more (Yes in operation S14), an operation for configuring internal circuit blocks may be performed, such that the memory device 300 (e.g., DRAM) performs an interface according to the LPDDR4X standard (operation S15). On the other hand, when the second power voltage VDD2 is not greater than the first power voltage VDDQ by the threshold value (e.g., α) (No in operation S14), an operation for configuring internal circuit blocks may be performed, such that the memory device performs an interface according to the LPDDR4 standard (operation S16). In other words, mode selector 342 selectively generates the mode selecting signal Sel_mode when the received calibrating (ZQ Calibrating) command corresponds to the initial calibrating command (Yes in operation S12) so that the memory device performs an interface according to the LPDDR4X standard (operation S15) or the LPDDR4 standard (operation S16). Furthermore, when the mode selecting operation and the configuring operation as described above are completed, a ZQ calibrating operation according to an instruction from the memory controller may be performed (operation S17).

Figure 7:
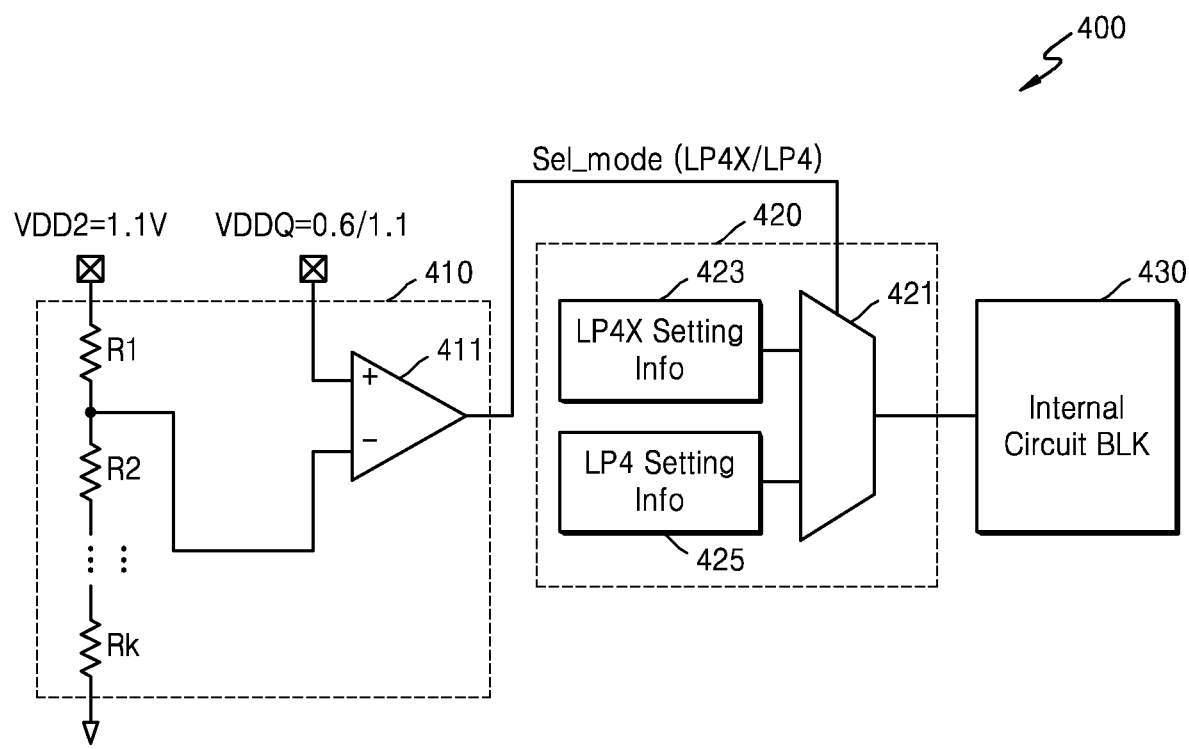
FIG. 7 illustrates a block diagram of a mode selector and a mode controller according to an example embodiment of the inventive concepts.

FIG. 7 illustrates a block diagram of a mode selector and a mode controller according to an example embodiment of the inventive concepts.

Referring to FIG. 7, memory device 400 includes a mode selector 410. The mode selector 410 receives the first power voltage VDDQ via a first pad and the second power voltage VDD2 via a second pad. The first power voltage VDDQ and the second power voltage VDD2 may be provided by a power management integrated circuit such as PMIC 11 shown in FIG. 1 for example. The mode selector 410 includes a differential amplifier (or a comparator) 411 that may generate an output according to a level difference between the first power voltage VDDQ and the second power voltage VDD2. The output of the differential amplifier 411 may correspond to the mode selecting signal Sel_mode as described above.

In the LPDDR4 standard or the LPDDR4X standard, the first power voltage VDDQ and the second power voltage VDD2 may have various voltage levels. For example, the second power voltage VDD2 may have a voltage level of 1.1V in both the LPDDR4 standard and the LPDDR4X standard. On the other hand, the first power voltage VDDQ may have a voltage level of 1.1V in the LPDDR4 standard and may have a voltage level of 0.6V in the LPDDR4X standard. For example, at least one of the first power voltage VDDQ and the second power voltage VDD2 may be voltage-divided and supplied to one node of the differential amplifier 411. FIG. 7 shows an example in which the second power voltage VDD2 is voltage-divided by a plurality of resistors R1, R2 to Rk and the divided second power voltage VDD2 is provided to one node (inverting node) of the differential amplifier 411, and the first power voltage VDDQ is provided to a second node (non-inverting node). In the operation for detecting the voltage levels of the first power voltage VDDQ and the second power voltage VDD2 as described previously as performed by the mode selector 410 for example, the voltage-divided second power voltage VDD2 corresponds to a reference voltage level, and a mode selecting operation may be performed based on whether the first power voltage VDDQ is greater than or is less than the reference voltage level.

The mode controller 420 may include setting information for configuring operation according to a plurality of standards and, in response to a mode selecting signal Sel_mode, may provide setting information corresponding to any one standard to an internal circuit block 430 inside the memory device 400. In an embodiment, the setting information may include LP4X setting information stored in a memory or register 423 for example, and LP4 setting information stored in memory or register 425 for example, although the setting information is not limited as stored in registers. According to an example embodiment, the mode controller 420 may include setting information for a plurality of standards that are generated based on certain information (e.g., MRS information) provided from an external memory controller (such as memory controller 100 shown in FIG. 1 for example), and a selector 421 may output the setting information corresponding to any one standard in response to the mode selecting signal Sel_mode.

The internal circuit block 430 may perform an internal configuring operation in response to the mode selecting signal Sel_mode and/or setting information according to a selected standard. For example, the setting information may be provided to a calibrating circuit (such as calibrating circuit 330 shown in FIG. 3 for example) described previously, and various components in the calibrating circuit may have states corresponding to the setting information. Furthermore, the value of a control signal (or a control code) provided from the calibrating circuit may vary according to the setting information, and states of various circuit blocks like an output driver (such as output driver 3210 shown in FIG. 4 for example) and an ODT circuit (such as ODT circuit 322 such as shown in FIG. 5 for example) may be configured based on the control signal (or the control code). Furthermore, various types of circuit blocks performing different operations in the LPDDR4 standard and the LPDDR4X standard may be included in the memory device 400, and configurations of the circuit blocks may be adjusted differently through a mode selecting operation according to an example embodiment. For example, a gain of an input buffer for receiving write data may be adjusted based on the setting information, and the level of an input reference voltage used for determining the logical state of the write data may be also adjusted based on the setting information.

Figure 8:
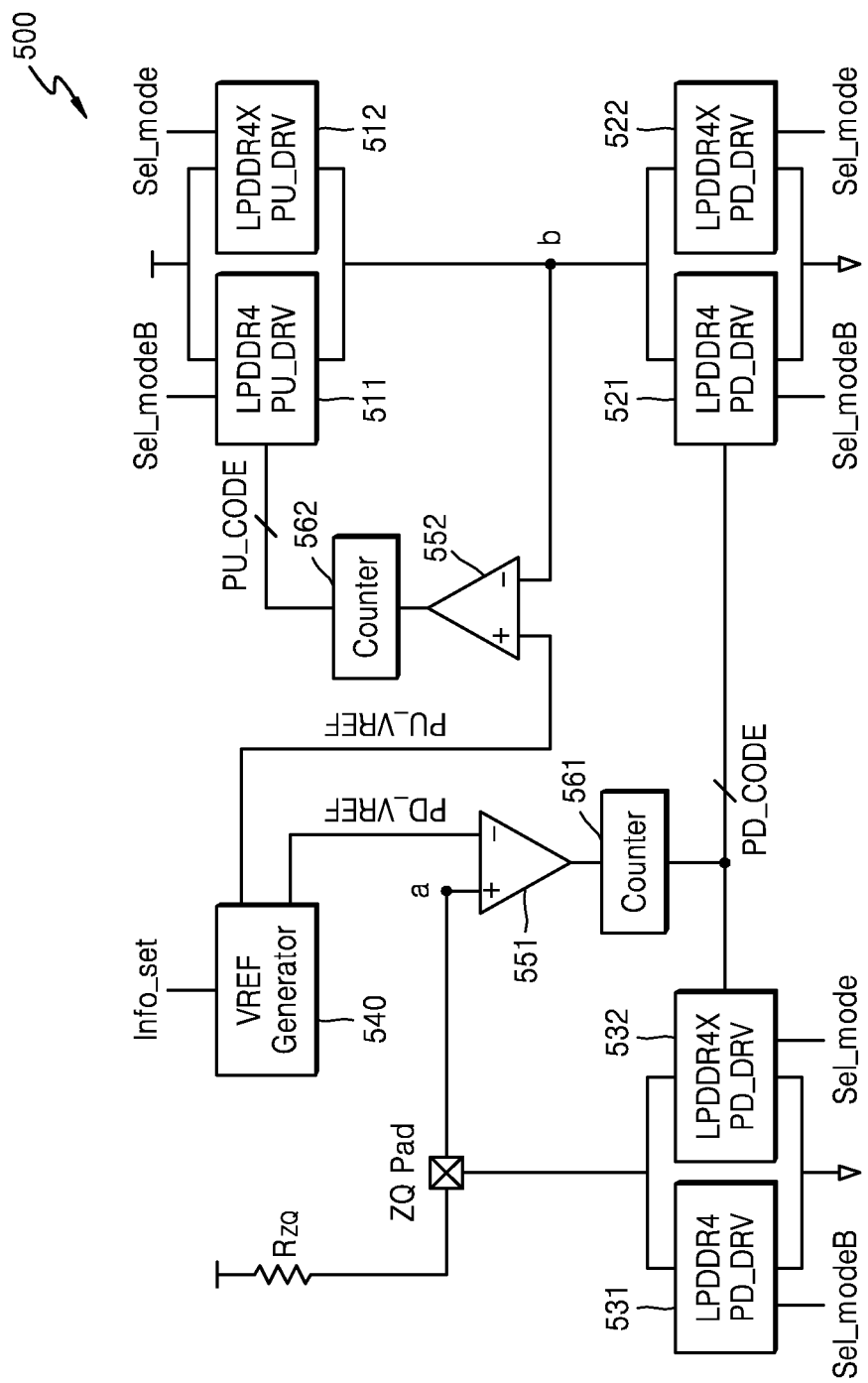
FIG. 8 illustrates a diagram of a calibrating circuit included in a memory device according to an example embodiment of the inventive concepts.
Figure 9:
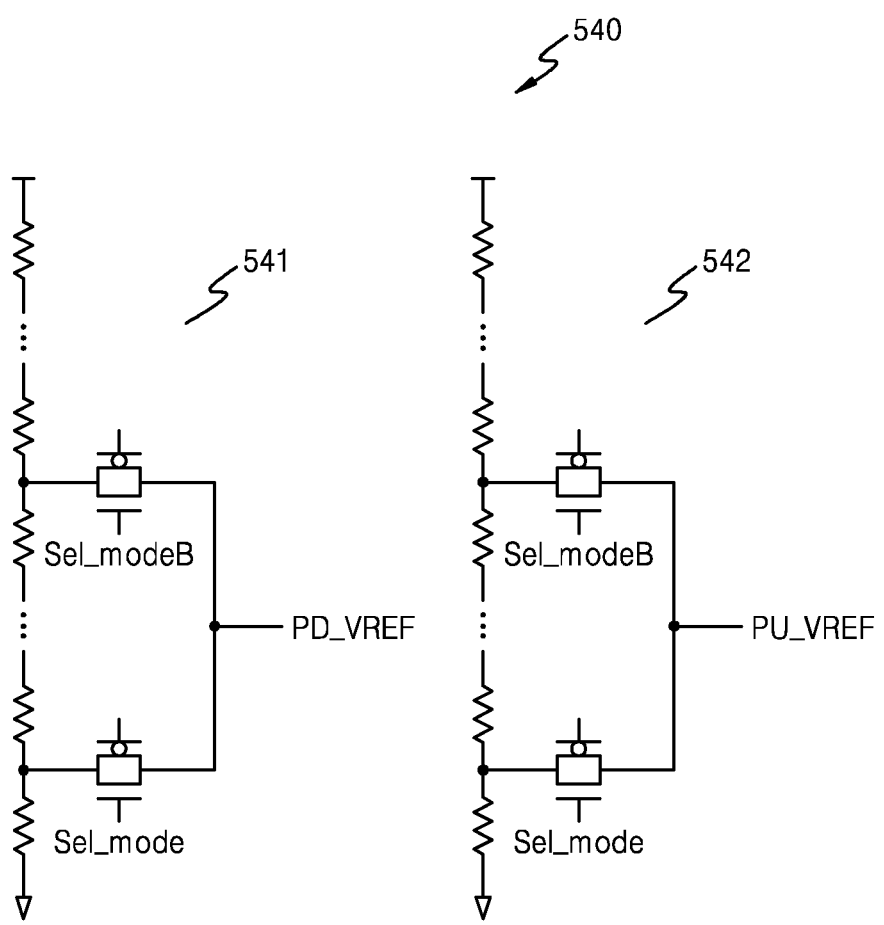
FIG. 9 illustrates a diagram of a reference voltage generator of a calibrating circuit included in a memory device according to an example embodiment of the inventive concepts.

FIG. 8 illustrates a diagram of a calibrating circuit included in a memory device according to an example embodiment of the inventive concepts. FIG. 9 illustrates a diagram of a reference voltage generator of a calibrating circuit included in a memory device according to an example embodiment of the inventive concepts.

Referring to FIG. 8, calibrating circuit 500 may include circuits corresponding to a plurality of standards. For example, calibrating circuit 500 may include a duplicate pull-up driver 511 and duplicate pull-down drivers 521 and 531 corresponding to the LPDDR4 standard, and may also include a duplicate pull-up driver 512 and duplicate pull-down drivers 522 and 532 corresponding to the LPDDR4X standard. The duplicate pull-up driver 511 and the duplicate pull-down drivers 521 and 531 may correspond to duplicate circuits of a pull-up unit and a pull-down unit of an output driver in the LPDDR4 standard. Furthermore, the duplicate pull-up driver 512 and the duplicate pull-down drivers 522 and 532 may correspond to duplicate circuits of a pull-up unit and a pull-down unit of an output driver in the LPDDR4X standard. Mode selecting signals Sel_mode are provided to the duplicate drivers 511, 521 and 531 corresponding to the LPDDR4 standard, and mode selecting signals Sel_modeB are provided to the duplicate drivers 512, 522 and 532 corresponding to the LPDDR4X standard.

Furthermore, the calibrating circuit 500 may further include a reference voltage generator 540, first and second comparators 551 and 552, a first counter 561, and a second counter 562. The reference voltage generator 540 may generate a first reference voltage PD_VREF for pull-down calibrating and a second reference voltage PU_VREF for pull-up calibrating responsive to setting information Info_set. The first reference voltage PD_VREF is provided to one input end (e.g., an inverting node) of the first comparator 551 and the second reference voltage PU_VREF is provided to one input end (e.g., a non-inverting node) of the second comparator 552.

The first comparator 551 compares the voltage of a first node a connected to a ZQ pad with the first reference voltage PD_VREF, and the first counter 561 may generate a pull-down control code PD_CODE based on a counting operation according to a result of the comparison. Transistors in the duplicate pull-down drivers 531 and 532 are controlled to be on/off in response to the pull-down control code PD_CODE, and, through a pull-down calibrating operation, a pull-down control code PD_CODE for making the internal resistance of each of the duplicate pull-down drivers 531 and 532 become identical to a ZQ resistance Rzq outside the memory device may be generated.

Furthermore, the second comparator 552 compares a voltage of a second node b between the duplicate pull-up drivers 511 and 512 and the duplicate pull-down drivers 521 and 522 with the second reference voltage PU_VREF, and the second counter 562 may generate a pull-up control code PU_CODE based on a counting operation according to a result of the comparison from the second comparator 552. Transistors in the duplicate pull-up drivers 511 and 512 are controlled to be on/off in response to the pull-up control code PU_CODE, and, through a pull-up calibrating operation, a pull-up control code PU_CODE for making the voltage level VOH of output data of an output driver reach a target level may be generated.

The voltage level VOH of the output data as previously described with respect to FIG. 4 for example may be adjusted based on the pull-up control code PU_CODE from the calibrating circuit 500. Furthermore, an ODT resistance as previously described with respect to FIG. 5 for example may be adjusted based on the pull-down control code PD_CODE. According to an example embodiment, at least one of the pull-up control code PU_CODE and the pull-down control code PD_CODE may have different values in the LPDDR4 standard and the LPDDR4X standard. For example, the reference voltage generator 540 may generate a first reference voltage PD_VREF and a second reference voltage PU_VREF having different levels in the LPDDR4 standard and the LPDDR4X standard.

FIG. 9 shows an example of the reference voltage generator 540 of FIG. 8. As shown in FIG. 9, the reference voltage generator 540 includes a first voltage divider 541 for generating a first reference voltage PD_VREF and a second voltage divider 542 for generating a second reference voltage PU_VREF. Furthermore, the mode selecting signal Sel_mode as described previously may be provided to each of the first voltage divider 541 and the second voltage divider 542. The voltage dividing operation may be adjusted according to the mode selecting signal Sel_mode, and the voltage levels of the first reference voltage PD_VREF and the second reference voltage PU_VREF may vary based thereon.

According to an example embodiment as described above, the calibrating circuit 500 may include drivers, that is the duplicate pull-up driver 511, the duplicate pull-down driver 521, and the duplicate pull-down driver 531 corresponding to the LPDDR4 standard, and drivers, that is the duplicate pull-up driver 512, the duplicate pull-down driver 522, and the duplicate pull-down driver 532 corresponding to the LPDDR4X standard. Drivers corresponding to any one of the standards are selectively enabled according to the mode selecting signal Sel_mode, and thus a calibrating operation according to the selected standard may be performed. Furthermore, although FIG. 8 shows that the reference voltage generator 540 controls the levels of the first reference voltage PD_VREF and the second reference voltage PU_VREF in response to the setting information Info_set, the levels of the first and second reference voltages PD_VREF and PU_VREF may also be adjusted based on the mode selecting signal Sel_mode described above.

Figure 10A:
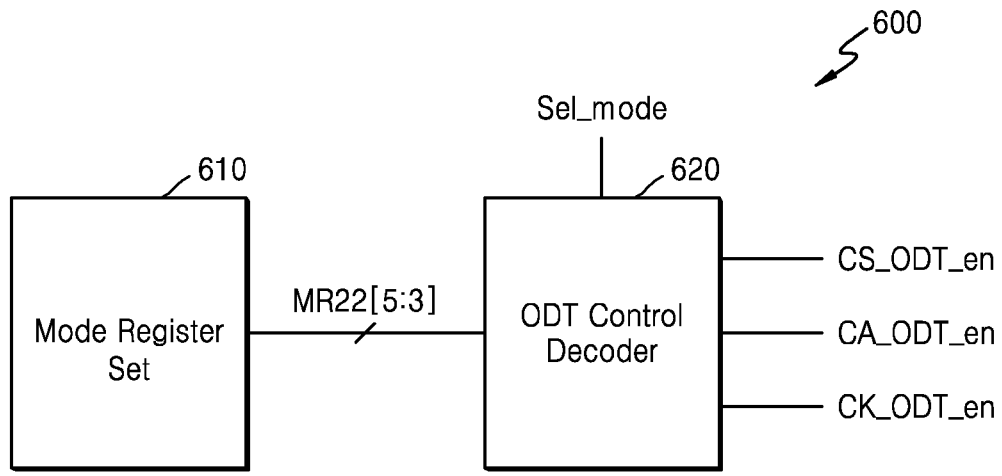
FIG. 10A illustrates a block diagram of a mode controller of a memory device according to an example embodiment of the inventive concepts.
Figure 10B:
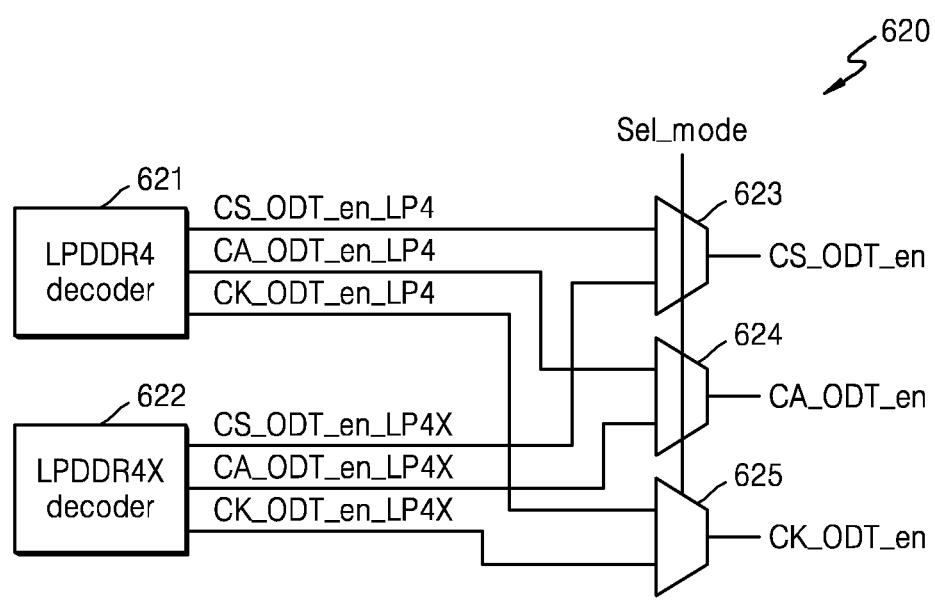
FIG. 10B illustrates a block diagram of a control decoder of the mode controller of a memory device according to an example embodiment of the inventive concepts.

FIG. 10A illustrates a block diagram of a mode controller of a memory device according to an example embodiment of the inventive concepts. FIG. 10B illustrates a block diagram of a control decoder of the mode controller of a memory device according to an example embodiment of the inventive concepts.

Referring to FIG. 10A, the mode controller 600 includes a mode register set (MRS 610) and a control decoder 620. The mode controller 600 may include components for generating setting information for various circuit blocks in a memory device, and an ODT control decoder is shown in FIG. 10A as an example of the control decoder 620. For example, the mode controller 600 may correspond to the mode controller 220 in FIGS. 1 and 2 and the mode controller 343 in FIG. 3.

A plurality of pieces of mode register information may be included in the MRS 610, and a plurality of pieces of field information (e.g., MR22[5:3]) of some of the mode register information may be used for controlling an ODT circuit. The control decoder 620 may perform a decoding operation and a selecting operation on the field information MR22[5:3] in response to the mode selecting signal Sel_mode.

For example, referring to FIG. 10B, the control decoder 620 includes a first decoder 621 for generating setting information according to the LPDDR4 standard (e.g., respective setting information CS_ODT_en_LP4, CA_ODT_en_LP4 and CSK_ODT_en_LP4), a second decoder 622 for generating setting information according to the LPDDR4X standard (e.g., respective setting information CS_ODT_en_LP4X, CA_ODT_en_LP4X, and CSK_ODT_en_LP4X), and selectors 623, 624 and 625. The first decoder 621 and the second decoder 622 may output setting information having different values in response to the same field information MR22[5:3].

The selectors 623, 624 and 625 may selectively output a decoding result of the first decoder 621 or a decoding result of the second decoder 622 respectively as setting information CS_ODT_en, CA_ODT_en, and CK_ODT_en in response to the mode selecting signal Sel_mode. The enabling of the ODT circuit regarding various types of signals may be controlled according to setting information CS_ODT_en, CA_ODT_en, and CK_ODT_en from the selectors 623 to 625. For example, types of signals providing termination resistance may be different in the LPDDR4 standard and the LPDDR4X standard.

Figure 11:
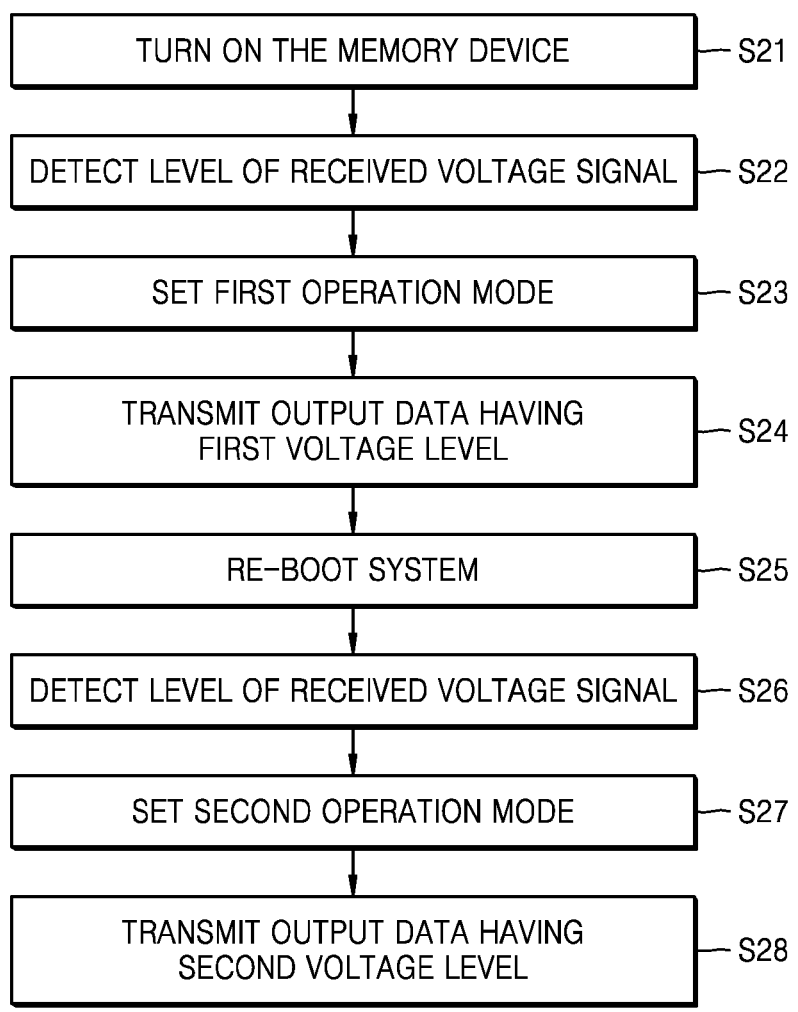
FIG. 11 illustrates a flowchart of a method of operating a memory device, according to an example embodiment of the inventive concepts.

FIG. 11 illustrates a flowchart of a method of operating a memory device, according to an example embodiment of the inventive concepts.

Referring to FIG. 11, as power is supplied to a memory device (e.g., 300 in FIG. 3), an initialization operation of the memory device is performed (operation S21) by control logic 340 for example. As a plurality of power voltages are provided to the memory device, the memory device (e.g., mode selector 342) may detect the level(s) of one or more of the voltage signals (operation S22). For example, in the above-described embodiments, the first power voltage VDDQ and the second power voltage VDD2 may be provided to the memory device according to the LDDR standard, and a level difference between the first power voltage VDDQ and the second power voltage VDD2 may be detected.

The operation mode of the memory device may be configured (e.g., by mode controller 343) according to the detected level difference (operation S23). For example, an operation for configuring internal circuit blocks may be performed, such that the memory device communicates with a memory controller (such as memory controller 100 in FIG. 1 for example) according to an interface of the LPDDR4 standard or an interface of the LPDDR4X standard. For example, when a first operation mode is set for the memory device to communicate according to an interface of the LPDDR4 standard, the memory device may receive the first power voltage VDDQ having a relatively large level as compared to the LPDDR4X standard, and the logic high level of output data driven and output by an output driver may have a first voltage level (operation S24).

Thereafter, a reboot operation for a system including the memory device may be performed (operation S25), and the level of a voltage signal provided to the memory device after the rebooting operation may be detected (operation S26) (e.g., mode selector 342). For example, when the memory device is connected to a memory controller communicating therewith according to an interface of another standard, the memory device may receive a voltage signal having a level different from that of a previous voltage level, wherein a level difference between the first power voltage VDDQ and the second power voltage VDD2 may differ from that before the system is re-booted.

The memory device may set the operation mode of the memory device to a second operation mode (e.g., by mode controller 343) according to a result of detecting the level of the voltage signal (operation S27). For example, an operation for configuring internal circuit blocks may be performed to perform communication according to an interface of the LPDDR4X standard. For example, the memory device may receive a supply voltage VDDQ having a relatively low level as compared to that of the LPDDR4 standard, and the logic high level of output data driven and output by an output driver may have a second voltage level (operation S28).

Figure 12:
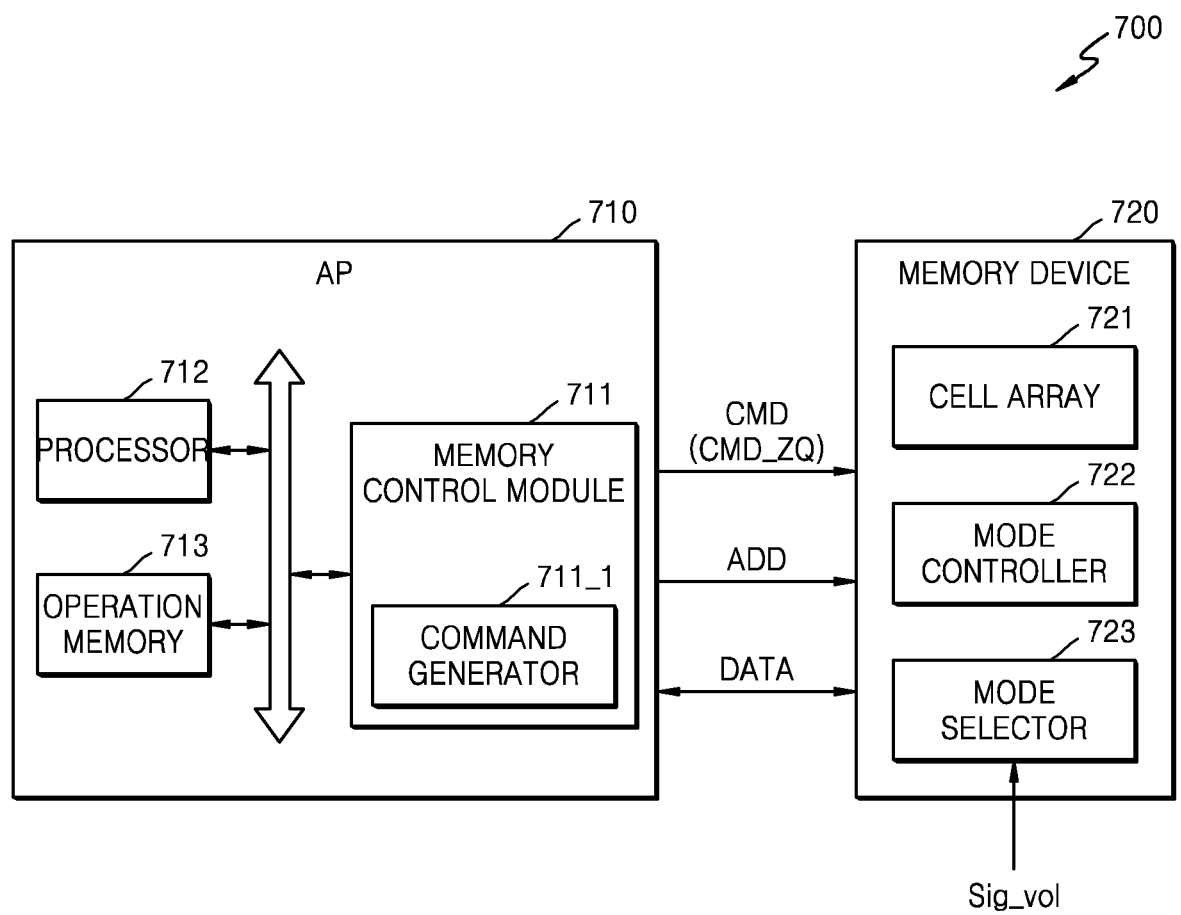
FIG. 12 illustrates a block diagram of another memory system according to an example embodiment of the inventive concepts.

FIG. 12 illustrates a block diagram of another memory system according to an example embodiment of the inventive concepts. FIG. 12 shows a data processing system 700 including an application processor 710 and a memory device 720, wherein a memory control module 711 in the application processor 710 and the memory device 720 may constitute the memory system. The memory control module 711 also includes a command generator 711_1, and the command generator 711_1 may generate a command CMD for controlling various operations of the memory device 720. According to the embodiment described previously, the command generator 711_1 may generate the calibrating command CMD_ZQ, and the memory device 720 may perform a mode determining operation and a configuring operation as described above in response to the calibrating command CMD_ZQ.

The application processor 710 may perform functions of a host. Furthermore, the application processor 710 may be implemented as a system-on-chip (SoC). The SoC may include a system bus (not shown) to which a protocol having a certain standard bus standard is applied and may include various intellectual properties (IP) connected to the system bus. As a standard specification of the system bus, an advanced microcontroller bus architecture (AMBA) protocol of the Advanced RISC Machine (ARM) may be applied. Bus types of the AMBA protocol may include for example Advanced High-Performance Bus (AHB), Advanced Peripheral Bus (APB), Advanced Extensible Interface (AXI), AXI4, AXI Coherency Extensions (ACE), among other bus types. Furthermore, other types of protocols including uNetwork of SONICs Inc., CoreConnect of IBM, and Open Core Protocol of OCP-IP may be applied.

The application processor 710 further includes a processor 712 and an operation memory 713 connected via the system bus. The processor 712 may control various operations within the application processor 710 and, for example, may control the memory control module 711 to access the memory device 720. Furthermore, the processor 712 may perform various controlling operations using software by executing programs, and the operation memory 713 may store programs for the controlling operations. According to an example embodiment, the application processor 710 may further include an Intellectual Properties (IP) block that performs functions as a modem. In this case, the application processor 710 may be referred to as a ModAP™.

The memory device 720 includes a mode selector 723 and a mode controller 722 according to the embodiments described previously. The mode selector 723 may receive a voltage signal Sig_Vol from the outside, perform a voltage detection operation on the voltage signal Sig_Vol, and provide a result of determining an operation mode according to a result of voltage detection. Furthermore, the mode controller 722 may store setting information regarding a plurality of standards and, in response to a result of determination from the mode determiner 723, provide setting information regarding any one standard to circuit blocks inside the memory device 720.

Figure 13:
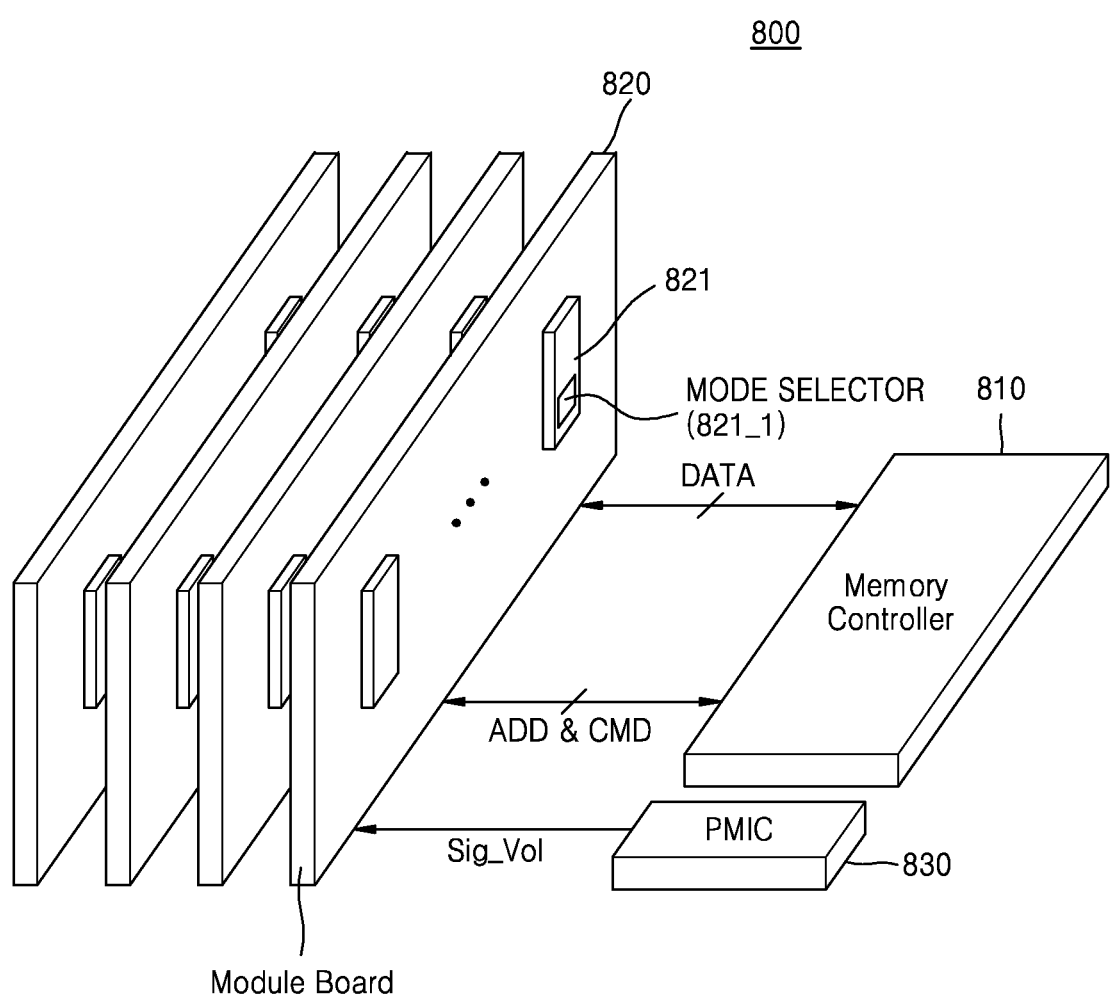
FIG. 13 illustrates a diagram of still another memory system according to an example embodiment of the inventive concepts.

FIG. 13 illustrates a diagram of another example of a memory system according to an example embodiment of the inventive concepts.

Referring to FIG. 13, memory system 800 includes a memory controller 810 and one or more memory modules 820. The memory module 820 includes a module board on which one or more memory devices 821 according to an example embodiment are mounted. Furthermore, the memory module 820 may be implemented as a single in-line memory module (SIMM) or a dual inline memory module (DIMM). Furthermore, the memory system 800 may further include a PMIC 830. The PMIC 830 may provide a voltage signal Sig_Vol including the various power voltages described above to the memory module 820.

The memory device 821 may include a mode selector 821_1 according to the embodiments described above. Furthermore, although not shown in FIG. 13, the memory device 821 may further include a mode controller for configuring circuit blocks therein according to a result of mode selection. The mode selector 821_1 may detect the level of the voltage signal Sig_Vol provided by the PMIC 830 and select any one of operation modes corresponding to a plurality of standards. For example, the LPDDR4 standard mode may be selected as the operation mode or the LPDDR4X standard mode may be selected as the operation mode.

As described above, example embodiments have been disclosed in the drawings and specification. While the embodiments have been described herein with reference to specific terms, it should be understood that they have been used only for the purpose of describing the inventive concepts and not for limiting the scope of the inventive concepts as defined in the claims. Therefore, one of ordinary skill in the art will appreciate that various modifications and equivalent embodiments are possible without departing from the scope of the inventive concepts. Accordingly, the true scope of protection of the inventive concepts should be determined by the technical idea of the appended claims.

What is claimed is:

1. A memory device comprising:
a cell array comprising a plurality of memory cells;
a mode selector configured to detect a level of at least one voltage signal externally provided and select any one of a plurality of operation modes corresponding to a plurality of standards according to a result of detecting the level of the at least one voltage signal;
a mode controller configured, in response to a mode selecting signal from the mode selector, to output setting information for setting the memory device to communicate with a memory controller via an interface according to a selected standard from among the plurality of standards; and
a calibrating circuit configured to generate a control code for controlling circuit blocks in the memory device according to the setting information,
wherein the mode selector is configured to receive a first power voltage and a second power voltage as the at least one voltage signal and to generate the mode selecting signal by detecting a difference between a level of the first power voltage and a level of the second power voltage.

2. The memory device of claim 1, wherein the mode selector is configured to receive the first power voltage and the second power voltage from an external power management integrated circuit (PMIC).

3. The memory device of claim 1, wherein the memory device communicates with the memory controller via the interface according to a low power double data rate 4 (LPDDR4) standard 4 or a low power double data rate 4X (LPDDR4X) standard respectively as the first power voltage and the second power voltage, the at least one voltage signal includes the first power voltage and the second power voltage defined in the LPDDR4 standard and the LPDDR4X standard, and
the mode selector is configured to select one of a first operation mode from among the plurality of operation modes for performing the interface according to the LPDDR4 standard and a second operation mode from among the plurality of operation modes for performing the interface according to the LPDDR4X standard, based on a result of detecting the difference between the level of the first power voltage and the level of the second power voltage.

4. The memory device of claim 3, wherein the mode selector comprises a voltage divider configured to divide the second power voltage and a comparator, and
the comparator is configured to generate the mode selecting signal by comparing the level of the first power voltage with a voltage level generated as a result of dividing the second power voltage.

5. The memory device of claim 1, wherein the circuit blocks comprise an output driver for outputting read data to the memory controller, and
the calibrating circuit is configured to generate as the control code a first control code for adjusting a voltage level of the read data to a first level in response to the setting information when a first operation mode from among the plurality of operation modes is set, and for adjusting the voltage level of the read data to a second level in response to the setting information when a second operation mode from among the plurality of operation modes is set.

6. The memory device of claim 5, wherein the circuit blocks further comprise an on-die termination (ODT) circuit configured to provide a termination resistor during a data write operation, and
the calibrating circuit is configured to generate as the control code a second control code for enabling the ODT circuit in response to the setting information when the first operation mode is set and disabling the ODT circuit in response to the setting information when the second operation mode is set.

7. The memory device of claim 1, wherein responsive to a calibrating command provided by the memory controller, the mode selector is configured to generate the mode selecting signal before a calibrating operation is performed.

8. The memory device of claim 7, wherein the mode selector is configured to selectively generate the mode selecting signal when the calibrating command provided by the memory controller corresponds to an initial calibrating command.

9. The memory device of claim 1, wherein the mode controller comprises a mode register set (MRS) configured to store mode register information having a plurality of pieces of field information provided by the memory controller,
the mode controller is configured to output as the setting information first setting information for the interface according to a low power double data rate 4 (LPDDR4) standard through a first decoding operation on the plurality of pieces of field information when a first operation mode according to the LPDDR4 standard is selected from among the plurality of operation modes, and
the mode controller is configured to output as the setting information second setting information for the interface according to a low power double data rate 4X (LPDDR4X) standard through a second decoding operation on the plurality of pieces of field information when a second operation mode according to the LPDDR4X standard is selected from among the plurality of operation modes.

10. A memory device comprising:
a memory cell array comprising a plurality of memory cells;
a mode selector configured to detect a level of at least one power voltage externally provided and select one of a low power double data rate 4 (LPDDR4) standard mode and a low power double data rate 4X (LPDDR4X) standard mode as a standard for interfacing with a memory controller according to a result of detecting the level of the at least one power voltage;
a mode controller configured to output setting information corresponding to a selected standard mode in response to a mode selecting signal from the mode selector; and
a calibrating circuit configured, in response to the setting information from the mode controller, to generate a first control code for adjusting a voltage level of output data of the memory device to a first level in the LPDDR4 standard mode and adjusting the voltage level of the output data of the memory device to a second level in the LPDDR4X standard mode, the second level being different from the first level,
wherein the at least one power voltage comprises a first power voltage and a second power voltage, and the mode selector is configured to select the LPDDR4 standard mode or the LPDDR4X standard mode according to a difference between a level of the first power voltage and a level of the second power voltage.

11. The memory device of claim 10, wherein the first power voltage powers an input/output circuit of the memory device and the second power voltage powers a peripheral circuit.

12. The memory device of claim 10, further comprising an output driver configured to generate the output data, wherein the output driver comprises a pull-up unit comprising one or more first transistors and a pull-down unit comprising one or more second transistors, wherein the calibrating circuit comprises:
a first comparator configured to compare a level of a first internal voltage with a level of a first reference voltage, and generate a first comparison result;
a first counter configured to generate a first control code for controlling the one or more second transistors of the pull-down unit based on the first comparison result; and
a reference voltage generator configured to generate the first reference voltage and adjust the first reference voltage differently in the LPDDR4 standard mode and the LPDDR4X standard mode in response to the setting information.

13. The memory device of claim 12, wherein the calibrating circuit further comprises:
a second comparator configured to compare a level of a second internal voltage with a level of a second reference voltage, and generate a second comparison result; and
a second counter configured to generate a second control code for controlling the one or more first transistors of the pull-up unit based on the second comparison result,
wherein the reference voltage generator is further configured to generate the second reference voltage and adjust the second reference voltage differently in the LPDDR4 standard mode and the LPDDR4X standard mode in response to the setting information.

14. The memory device of claim 13, further comprising an on-die termination (ODT) circuit,
wherein the calibrating circuit is configured, in response to the setting information from the mode controller, to generate the first control code for controlling the ODT circuit to any one of an enabled state and a disable state in the LPDDR4 standard mode and controlling the ODT circuit to another one of the enabled state and the disable state in the LPDDR4X standard mode.

15. A method of operating a memory device comprising a mode selector and a calibrating circuit, the method comprising:
receiving at the mode selector a first command and one or more power voltages during an initial operation of a system;
detecting, by the mode selector, levels of the one or more power voltages in response to the first command;
selecting, by the mode selector, an operation mode corresponding to any one selected from among a plurality of standards according to a result of the detecting the levels of the one or more power voltages; and
performing, by the calibrating circuit, a calibrating operation to adjust a voltage level of output data of the memory device and enable/disable an on-die termination (ODT) circuit according to the selected operation mode,
wherein said detecting the levels of the one or more power voltages comprises comparing a voltage level difference between a first power voltage and a second power voltage with a threshold value.

16. The method of claim 15, wherein the first command corresponds to an initial calibrating command during the initial operation of the system, and
the selecting of the operation mode is performed before an initial calibrating operation corresponding to the initial calibrating command is started.

17. The method of claim 15, wherein the memory device communicates with an external memory controller selectively via an interface according to one of a low power double data rate 4 (LPDDR4) standard and a low power double data rate 4X (LPDDR4X) standard, and
wherein said performing the calibrating operation comprises setting the voltage level of the output data to a first level to perform an interface according to the LPDDR4 standard, and setting the voltage level of the output data to a second level to perform an interface according to the LPDDR4X standard.

18. The method of claim 17, wherein said performing the calibrating operation comprises setting the ODT circuit to any one of an enabled state and a disabled state at the interface according to the LPDDR4 standard, and setting the ODT circuit to another one of the enabled state and the disabled state at the interface according to the LPDDR4X standard.

19. The method of claim 17, wherein the first power voltage and the second power voltage are power voltages respectively defined in a low power double data rate 4 (LPDDR4) standard and a low power double data rate 4X (LPDDR4X) standard.

20. The method of claim 17, wherein said selecting the operation mode comprises selecting a first operation mode corresponding to the LPDDR4 standard,
the method further comprising setting the operation mode of the memory device to a second operation mode corresponding to the LPDDR4X standard according to a result of said detecting the levels of the one or more power voltages received after the system is re-booted.

\* \* \* \* \*